(12) United States Patent
Koger et al.

(10) Patent No.: US 10,204,193 B2
(45) Date of Patent: Feb. 12, 2019

(54) LARGE SCALE ANALYSIS OF CATASTROPHIC WEATHER DAMAGE

(71) Applicant: Qrisq Analytics, LLC, Mobile, AL (US)

(72) Inventors: Thomas Lee Koger, Diamondhead, MS (US); Elizabeth Lia Valenti, Slidell, LA (US)

(73) Assignee: QRISQ ANALYTICS, LLC, Mobile, AL (US)

( * ) Notice: Subject to any disclaimer, the term of this patent is extended or adjusted under 35 U.S.C. 154(b) by 447 days.

(21) Appl. No.: 14/986,005

(22) Filed: Dec. 31, 2015

(65) Prior Publication Data

US 2017/0039307 A1 Feb. 9, 2017

Related U.S. Application Data

(60) Provisional application No. 62/202,667, filed on Aug. 7, 2015.

(51) Int. Cl.
 *G06F 17/50* (2006.01)

(52) U.S. Cl.
 CPC .............................. *G06F 17/5018* (2013.01)

(58) Field of Classification Search
 CPC ................................................. G06F 17/5018
 See application file for complete search history.

(56) References Cited

U.S. PATENT DOCUMENTS

| 8,280,633 | B1* | 10/2012 | Eldering et al. |
| 8,655,595 | B1 | 2/2014 | Green et al. |
| 8,775,219 | B2 | 7/2014 | Swanson et al. |
| 2013/0110558 | A1 | 5/2013 | Maher |
| 2013/0197807 | A1 | 8/2013 | Du et al. |
| 2014/0019166 | A1 | 1/2014 | Swanson et al. |
| 2014/0229420 | A1 | 8/2014 | Green et al. |
| 2016/0266932 | A1 | 9/2016 | Phelan et al. |

OTHER PUBLICATIONS

Jelley, B., "Summary of Available Meteorological and Hydrological Data Detailing the Impacts of Hurricane Katrina," 1000 N Beach Blvd., Bay St. Louis, Mississippi, Jun. 29, 2009, pp. 1-34.
Gorkavyi, N., et al., "Final Report: Evaluation of LIDAR Data in Obtaining Structural Elevation Data," Appendix J—LIDAR Automated Data Extraction Report, Computational Consulting Services, LLC, prepared for Dewberry, LLC, Jan. 31, 2004, pp. 297-379.

* cited by examiner

*Primary Examiner* — Syed A Roni
(74) *Attorney, Agent, or Firm* — Seed IP Law Group LLP

(57) ABSTRACT

Estimating storm damage on a large scale includes collecting geospatial data from a plurality of sensors disparately situated in a defined geographic area; collecting the geospatial data occurs before and during a determined or simulated significant weather event. Geospatial property attribute information for each of a plurality of real property structures within the defined geographic area is also provided. A supercomputer estimates a magnitude and duration of significant weather event forces at points associated with each of the plurality of real property structures according to a significant weather event model in order to produce at least one model output data set. The model output data set is applied to the geospatial property attribute information and, based on the application of model output data, damage to the plurality of real property structures is automatically estimated.

19 Claims, 6 Drawing Sheets

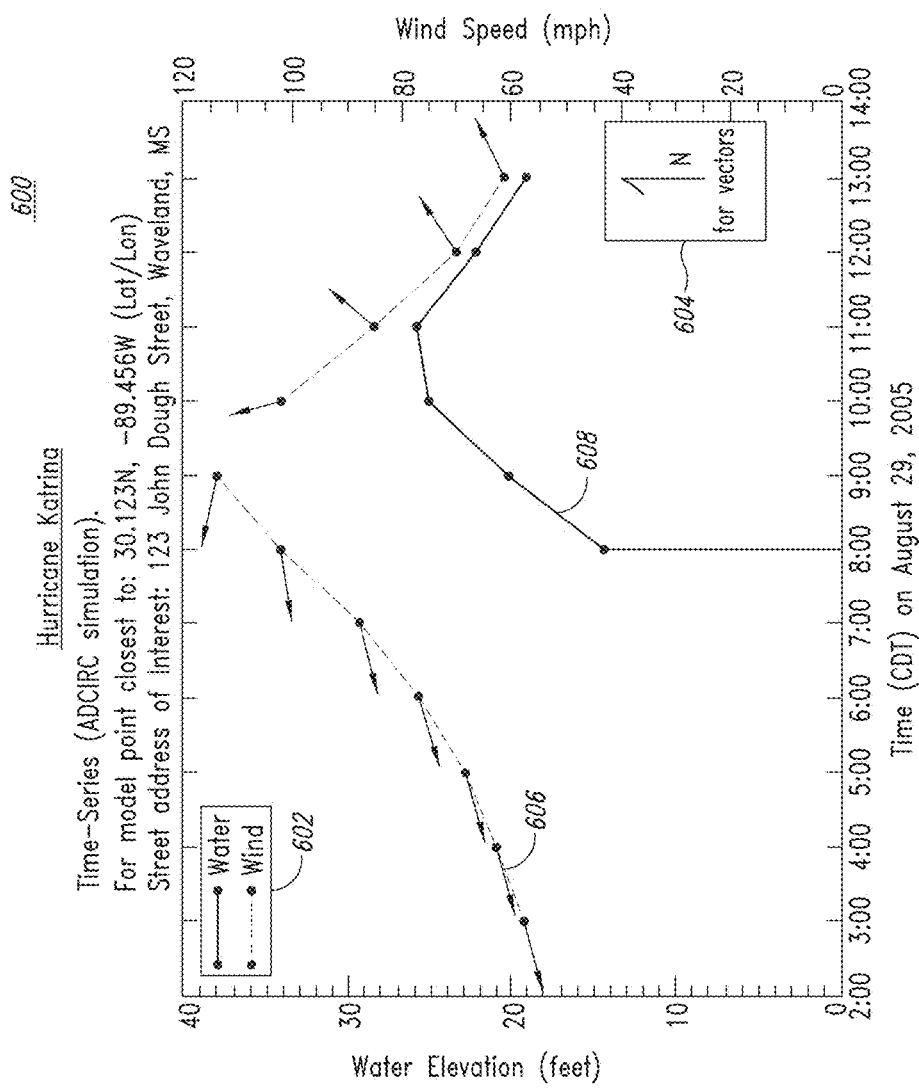

LARGE SCALE ANALYSIS OF CATASTROPHIC WEATHER DAMAGE

BACKGROUND

Technical Field

The present disclosure generally relates to large scale analysis of catastrophic weather damage. More particularly, but not exclusively, the present disclosure relates to gathering and analyzing a large amount of geographically diverse data and estimating storm damage based on a catastrophic weather event.

Description of the Related Art

It is well known that real property can be damaged during a storm, and that the impact of a single severe weather event can damage many hundreds or thousands of real property structures. In 2012, for example, "Hurricane Sandy" struck the Eastern United States. At the time, Hurricane Sandy, also known as "Super Storm Sandy" or simply "Sandy," was the second-costliest hurricane in United States history.

Powerful storms such as hurricanes are classified according to the Saffir-Simpson hurricane wind scale (SSHWS) into five categories. The categories are distinguished from each other by the intensity of sustained wind. A hurricane has a sustained wind of 74 miles per hour (mph). When this wind level is reached, the storm is said to be in category one of the SSHWS or simply, "Category 1."

TABLE 1

Categories under the SSHWS

| One | 74-95 mph |
| Two | 96-110 mph |
| Three | 111-129 mph |
| Four | 130-156 mph |
| Five | >=157 mph |

The five categories of the SSHWS are illustrated in Table 1. At peak intensity, when the storm first reached land in Cuba, Sandy was Category 3 storm. When Sandy advanced into the area off the Northeast U.S. coast, the storm had a measured diameter of more than 1000 miles and was a Category 2 hurricane. Outside the United States, Sandy caused hundreds of deaths and billions (USD) in property damage in Jamaica, Haiti, the Dominican Republic, Puerto Rico, and the Bahamas. In the U.S., the National Oceanic and Atmospheric Administration (NOAA) estimated that Hurricane Sandy caused $65 billion of property damage in 24 states.

In addition to the devastating effects of wind, flooding during a major storm is another cause of death and substantial property damage. The SSHWS categories that indicate wind velocity will provide some indication of the potential for flooding, but another measure is more accurate. The U.S. National Hurricane Center produces the Sea, Lake, and Overland Surge from Hurricanes (SLOSH) forecast. A SLOSH forecast is a model of predicted and then measured storm surge for a particular storm.

The SLOSH model takes several inputs including central pressure of a storm, storm size (e.g., diameter of the storm), forward motion of a storm, storm track, and highest sustained winds. Area topography, orientation of relevant bodies of water, depth of water, astronomical tides, and other physical features are also taken into account. One output of the SLOSH model is a Maximum Envelope of Water (MEOW) for a relevant area being modeled, which is a forecast of an expected storm surge.

Storm surge, which leads to flooding, is created by a number of geophysical and meteorological forces. A storm surge is a rising of coastal water that inundates normally dry land. The wind fields around a central low pressure system create the conditions for a storm surge. The depth and orientation of coastal water and the topography of the coastal area also play a part.

During a hurricane, the sustained wind blowing inward and a following low pressure area above the body of water cause a dome of water to rise up and "follow" the center of the storm. Other factors such as the Earth's rotation, normal tide height, and rainfall, also play a part in how high a storm surge may rise. Storm surges can be directly measured at coastal tidal stations as the difference between a forecast tide and an observed rise of water. The maximum observed storm surge in New Jersey during Hurricane Sandy was approximately 13 feet, and the surge caused substantial property damage.

Property owners contract with insurance companies for coverage of unexpected damage to their property. The contract, which is typically called an insurance policy, sets out details of the insurance coverage for the property. If the property is damaged or destroyed, the property owner contacts the insurance company and files a claim for loss. The insurance company investigates the claim and assesses the damage. When the company determines that the damage was caused by an event covered by the insurance policy, the insurance company facilitates repairs.

Investigation of the damage claim and assessment of the damage to a covered property is performed by an insurance adjuster. These individuals may also be called insurance claims adjusters, claims specialists, claims representatives, independent claims analysts, or some other like title.

The insurance adjuster is tasked with "scoping" a claim, which involves assessing the damage value of a given incident and providing a preliminary estimate of its total cost. In a typical situation, the estimate will account for the cost of cleaning up, repairing or replacing a property structure to as-before or like-new condition. The insurance adjuster will typically travel in person to the site of the calamity, where the damage will be inspected and where factual information pertaining to the loss will be recorded. The on-site inspection involves, as the case may be, walking, crawling, and climbing around the property; interviewing property owners, residents, and others; consulting records; taking photographs, audio, and/or video recordings; taking measurements; and taking notes. One known system and method for such claim scoping is described in U.S. patent application Ser. No. 14/643,504, entitled, "INSURANCE ADJUSTER CLAIM SCOPING," filed on Feb. 27, 2015 and now pending, incorporated by reference in its entirety.

Considering one exemplary case, a building roof is allegedly damaged in a storm. The insurance adjuster travels to the building, observes the visible roof damage, takes measurements, and records additional information about the roof such as the roof's surface material, underlayment, roof decking, structural rafters, and the like. Depending on the type and cause of the damage, the adjuster may record additional information related to venting, chimneys, skylights, and other structures. The purpose of the insurance adjuster site visit is to record sufficient information for the insurance company to validate a claim made by the insured entity and estimate the scope of the claim.

In another exemplary case, buildings, landscaping, service infrastructure, and personal property are all damaged in a storm surge after a hurricane. The insurance adjuster visits the property and measures high water marks in building structures and in other areas of the property. The adjuster may also discover and document that formerly stable ground has shifted, young landscaping has been washed away, and the stable root structure of mature foliage has been undermined. Within an individual property, the insurance adjuster may ascertain whether electrical systems, water supply and sewer lines, natural gas supply lines, and other service systems have been compromised. Turning to buildings and other such structures, the insurance adjuster may observe and document damage to building walls, foundations, driveways, patios, deck supports and deck structures, doors, windows, and even personal property. Similar to the purpose of the adjustor site visit in the case of roof damage, an objective of the insurance adjuster site visit after a hurricane is to observe and document information that an insurance company can use to verify and estimate covered property losses.

The insurance adjusting process is expensive and inherently risky. Insurance adjusters must travel to the site of each property where damage is reported and record a substantial amount of data including many measurements. The process is time-consuming, and insurance adjusters require physical skill and dexterity along with a significant amount of experience. In reconsidering even simple damage to a roof, for example, the skill, dexterity, and experience required by an insurance adjuster is plain to see. The insurance adjuster must access most or all of the roof structures in order to measure length, width, and angle (e.g., roof pitch) including many compound angles formed by peaks and valleys of intersecting faces of the roof, gables, dormers, chimneys, vents, skylights, and the like. In reconsidering damage caused by a storm surge, the insurance adjuster must be ready to face and work safely in areas of unstable ground and buildings and where immediate and latent dangers may be present. For example, the insurance adjuster may encounter natural gas leaks, live power lines, unstable piles of debris, fallen trees or trees with weakened root structures that are ready to fall, and other such dangers, all of which can be fatal if not recognized and dealt with properly. Without adequate knowledge and experience, the adjuster may also be exposed to latent dangers such as bacteria-laden fouled water, damaged and disturbed asbestos or other hazardous materials, and other perils. When a real property is damaged, safe access to the roof, foundation, crawlspace, basement, and other areas for observation and measurement may be difficult.

After a significant weather event such as a hurricane, insurance companies may deploy hundreds or thousands of insurance adjusters to the areas affected by the event. In such cases, adjusters may be tasked with reaching dozens of properties each day. The work is difficult, and it can be dangerous, and even though the adjusters are working very hard, many property owners will not see an adjuster for many days simply because of the size and scope of the damage. Reducing the time to safely observe and accurately measure the roof can make an insurance adjuster more efficient, safer, and thereby less expensive.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which in and of itself may also be inventive.

BRIEF SUMMARY

A property damage estimate method may be summarized as including collecting meteorological data, geospatial data, or both meteorological and geospatial data from a plurality of sensors disparately situated in a defined geographic area, the collecting occurring before, during, and in some cases after a determined significant weather event; providing geospatial property attribute information for each of a plurality of real property structures within the defined geographic area; estimating, with a super-computing capable device, a magnitude and duration of significant weather event forces at points associated with each of the plurality of real property structures according to at least one significant weather event model to produce at least one model output data set; applying data from the at least one model output data set to the geospatial property attribute information; and based on application of model output data set data to the geospatial property attribute information, automatically estimating damage to the plurality of real property structures. At least some of the plurality of sensors may include a light detection and ranging (LiDAR) circuit. The at least one significant weather event model may include processing at least one of terrain, atmospheric, and bathymetric model data with a finite element model. The finite element model may include a Triangular Irregular Network (TIN) finite element model representing ground and bathymetric surfaces. The Triangular Irregular Network (TIN) finite element model may represent ground cover and surface roughness. At least one significant weather event force may be a flood level. The at least one significant weather event model may include a hydrodynamic flood inundation model.

Estimating the magnitude and duration of the flood level at points associated with each of the plurality of real property structures may include determining a natural slope of ground around a real property structure; determining a lowest adjacent grade (LAG); estimating a height of flood above grade; and estimating the flood level at the real property structure. The at least one significant weather event model may include an advanced circulation (ADCIRC) storm surge model.

The property damage estimate method may include reconciling measured data associated with the determined significant weather event with corresponding data in the at least one model output data set; and re-estimating, with the super-computing capable device, the magnitude and duration of significant weather event forces at points associated with at least some of the plurality of real property structures to produce at least one updated model output data set.

A property damage estimating system may be summarized as including a memory structure, the memory structure arranged to store significant weather event modeling data, geospatial data, and at least one significant weather event model; a first computing device arranged to carry out acts according to the at least one significant weather event model, the first computing device further arranged to produce at least one model output data set defining estimated significant weather event force data over a defined geographic area of interest; a second computing device arranged to reconcile benchmarking data collected after a significant weather event with at least some of the significant weather event modeling data, the reconciled benchmarking data made available to the first computing device to update the at least one model output data set; and a third computing device arranged to statistically combine data from the at least one model output data set with at least some of the geospatial data to produce a damage estimate to a plurality of real property structures within the defined geographic area of interest. The first computing device and the second computing device may be a super-computing capable device. The significant weather event may be a hurricane. The defined geographic area of interest may be greater than 100 square miles and wherein the plurality of real property structures may be greater than 1,000. The at least one model output data set may define estimated flood water data, estimated wind force data, and estimated wind duration data.

A non-transitory computer-readable storage medium whose stored contents may configure a computing system to perform a method may be summarized as including collecting at least one of atmospheric model data and oceanographic model data; collecting ground model data; retrieving at least one significant weather event model; producing, with a super-computing capable device, a time series simulation of significant weather event forces that occur over a geographic area of interest during a significant weather event; interpolating the simulated significant weather event forces to a plurality of nodes within the geographic area of interest; collecting benchmark data associated with the significant weather event and feeding the collected benchmark data back to the super-computing capable device; and estimating damage to a plurality of real property structures within the geographic area of interest.

The non-transitory computer-readable storage medium may further include collecting LiDAR data associated with a plurality of points within the geographic area of interest; determining a natural slope of ground around a real property structure based on the collected LiDAR data; determining a lowest adjacent grade (LAG); estimating a height of flood above grade; and estimating a flood level associated with at least one real property structure. The significant weather event may be a man-made event. The at least one significant weather event model may include a Triangular Irregular Network (TIN) finite element model representing ground and bathymetric surfaces. The simulated significant weather event forces may include water forces and wind forces.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which:

FIG. 6 is an exemplary ADCIRC model output data set.

DETAILED DESCRIPTION

Figure 1:
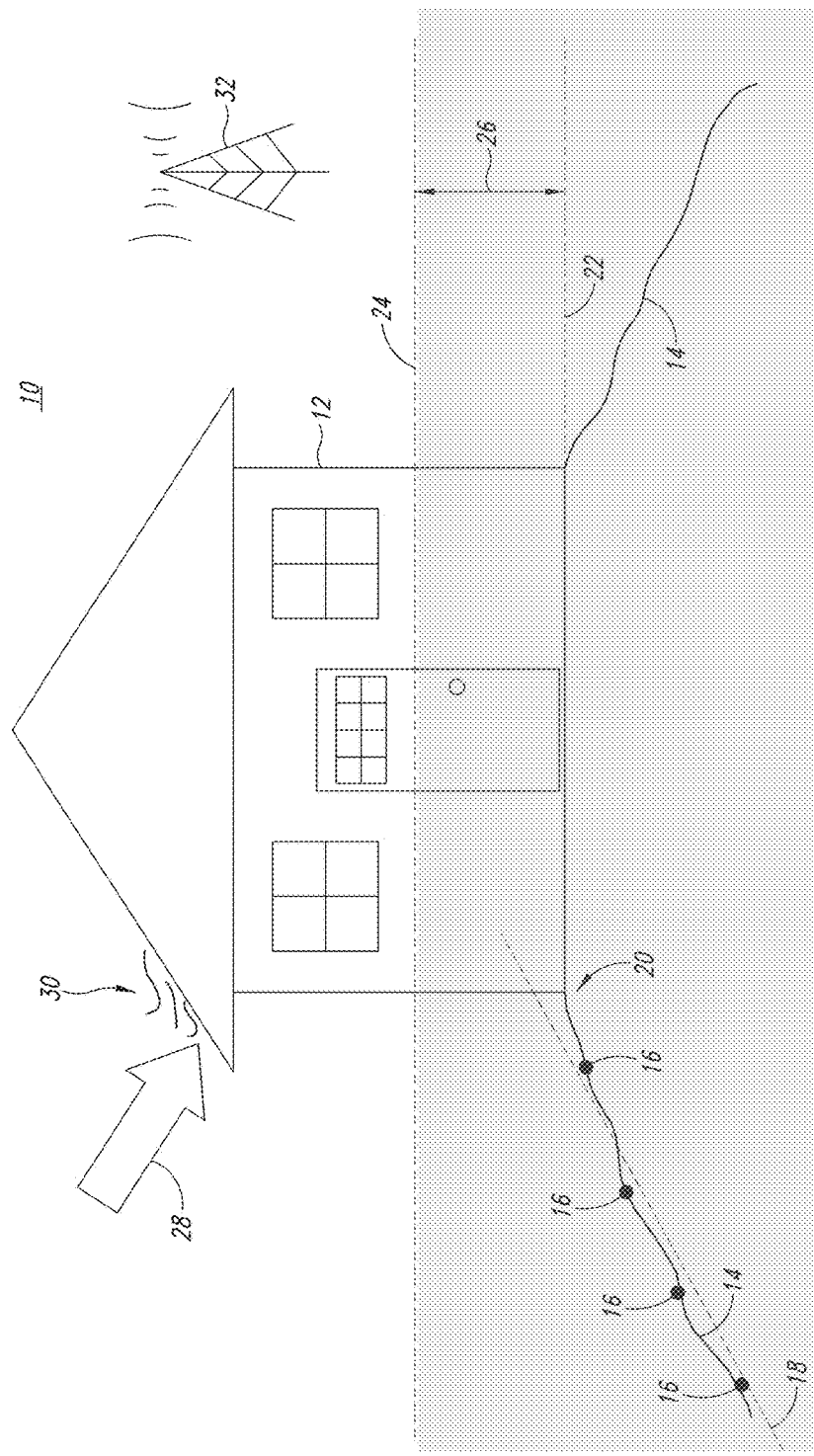
FIG. 1 illustrates one implementation of a computer automated storm damage estimation methodology.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with computing systems including client and server computing systems, as well as networks have not been shown or described in detail to avoid unnecessarily obscuring descriptions of the embodiments.

Insurance companies and other entities affected by significant weather events face ongoing information challenges in quantifying weather risks and in responding to insurance claims that result from significant weather events. As used herein, significant weather events include but are not limited to natural disasters such as blizzards, hurricanes, tsunamis, earthquakes, landslides, volcano eruptions, pestilence, famine, drought, fires, heat wave, tornadoes, cyclones, storm surge, and river flooding. The term "significant weather event" in the present disclosure may also include man-caused disasters such as events related to fracking, war, terrorist activity, industrial accident, nuclear emission, dam breach, weather control, and the like. These man-caused incidents are considered as significant weather events herein because their detrimental effect on large numbers of properties over vast geographic areas can be modeled and analyzed in similar ways that catastrophic and other high-impact significant weather events are modeled and analyzed.

To address challenges caused by significant weather events, the present inventors have conceived and developed structures and methods to realistically and accurately represent a significant weather event. The structures and processes can be applied to modeling catastrophic or otherwise significant weather events and to facilitate automated insurance claims adjustment.

In the present disclosure, problems associated with accurately estimating damage potential in advance of a significant weather event and performing insurance claims adjustment for actual losses following the event are addressed. Solutions are implemented with advanced computer modeling that receives and processes detailed, property-specific meteorological and geospatial data collected and stored before, during, and after the event. Conventional insurance adjuster processes that require tedious physical inspection to assess property damage and estimate losses can be automated. The automated processes are applied to augment or replace on-site property damage assessment.

Significant weather related events (e.g., catastrophic floods, windstorms, etc.) damage properties over vast geographic areas. These significant weather events result in mild to severe damage to dozens, hundreds, and thousands of properties spread across hundreds and thousands of square miles. Combined with the damages to individual properties, the resulting infrastructure damage, including damage to roads, drainage, and the power grid, presents severe access and workforce challenges to first responders, insurance adjusters, business interests, and recovery workers who enter the impacted areas.

Despite the scale and severity of significant weather events, insurance companies still want to rapidly assess damage to individual properties, facilitate the repair process, and compensate insured parties (i.e., property owners) for losses that result from wind, water, or other significant weather event related phenomena.

Insurance claims adjusting is a skill that develops through years of training and practice. Ongoing training and on-the-job experience are performed to improve the accuracy of on-site inspections and repair estimates. Significant weather events can require hundreds or thousands of adjusters performing multiple detailed on-site property inspections each day in an effort to settle all claims as quickly and accurately as possible. Practical limitations on the number of skilled adjusters available to work on significant weather events along with the time taken to adjust each claim results in property owners having to wait weeks, months, or some other substantially long time to receive compensation for their losses.

Fortunately, significant weather events do not occur frequently. On the other hand, the infrequency of significant weather events makes it difficult to maintain a large and highly trained insurance claims adjuster workforce that is ready to be deployed on a moment's notice. For these and other reasons, automation of these labor-intensive claims adjusting processes is urgently sought. The solutions presented herein to the problems caused by significant weather events can be used to augment skilled labor, increase insurance company response speed, and help mitigate substantial human impacts that accompany significant weather events.

In the present case, the inventors have discovered that operations conventionally associated with sending out an army of insurance adjusters after a significant weather event can be improved and made more efficient. In this respect, the inventors have conceived and developed a computer automated storm damage estimation system and method that is arranged to automatically integrate very large quantities of input data, model a significant weather event, provide output data to simulate losses due to the significant weather event, and apply the provided output data to automate insurance claims processing.

Significant weather events have been modeled using advanced supercomputer devices to implement purposefully designed formulae, calculations, algorithms, procedures, data processing, automated reasoning, and the like. The models have been applied to detailed geospatial property attributes, and the combination has produced substantially precise estimates of the magnitude and duration of weather-driven forces acting on specific structures. These results have been combined with damage estimating models to calculate the individual and specific cost to repair or replace the resulting damage to individual and specific structures.

The systems and methods developed and discussed in the present disclosure are scalable and produce results consistent with on-site observations made by insurance adjusters having many years of weather-catastrophe experience. In addition to wind and water forces produced during natural disasters, these same systems and methods may also be applied to forces produced during a wide variety of natural and man-made significant weather events.

FIG. 1 illustrates one implementation of a computer automated storm damage estimation methodology 10. In the figure, a real property structure (i.e., a house 12) is located in an area affected by a significant weather event such as a hurricane. During the hurricane, the house 12 has been flooded and damaged by significant weather event forces such as wind 28 that occurred during the hurricane.

The house 12 is located on a real property. In the automated methodology, the real property has a geocoded address. Based on the geocoded address, a wide variety of real property data may be programmatically collected from public and private databases such as municipal offices. The collected data may include the shape of the real property parcel; the location and orientation of structures on the real property; the characteristics of the structures such as size, height, footprint, building materials, number of rooms, the available public service infrastructure such as public water sewer supply, underground gas and electric utilities, width of the street, set back from the street, sidewalks, etc.; the topology of the land; foliage and characteristics of the foliage growing on the property; and other data. The data is stored in memory and available for use in the methodology.

In addition to the real property data, other data may be collected electronically using LiDAR, RADAR, or some other mechanism. For example, in FIG. 1, a plurality of bare earth classified LiDAR returns 16 are illustrated. The LiDAR returns are used to determine a local slope 18 of the real property and other topological characteristics. In some cases, the local slope 18 is determined and used in the methodology; in other cases, the local slope 18 validates or otherwise supports other topographical information programmatically retrieved and available. Using the data, a structural elevation point 20 where the slope of the real property grade intersects the building structure (i.e., the house 12) is determined. The structural elevation 20 is used to identify a lowest adjacent grade (LAG) 22 of the real property structure.

The collected data is analyzed, combined, and otherwise integrated to generate a digital elevation model (DEM), a digital surface model (DSM), a digital terrain model (DTM), or some other model of the real property. Generally speaking, each of the models is an electronic representation of the real property including or excluding some or all of the natural and man-made features located on the real property. In some embodiments described in the present disclosure, the generated model maps the ground surface elevation with trees and manmade features excluded and with an outline of each manmade structure included. This methodology to generate the model permits particular attention to be paid to sampled points (e.g., LiDAR returns) around the perimeter of manmade structures. The methodology to create the digital model is easily scaled, and a digital model can be created for hundreds, thousands, or any other number of real properties.

Significant weather events can be modeled before they occur or after they occur. In some cases, significant weather events are modeled both before and after they occur. The forces produced by a significant weather event can be modeled, and the effects of the specific forces on the particular features of each individual real property can also be modeled. In FIG. 1, a hurricane strikes and causes damage to the house 12. The house 12 is flooded to a particular height 24, and high velocity wind 28 damages the roof shingles 30 of the house 12.

Wind from a prospective or actual hurricane can be modeled, and water from a prospective or actual flood or storm surge can be modeled along with the changes in these forces over time. Other significant weather event forces can also be modeled. In the example of FIG. 1, the velocity and direction of the wind force 28 is determined, and the depth of floodwaters above grade 26 is determined. When the wind and water forces are determined, the type and amount of damage to a real property structure can be predicted.

The models in the computer automated storm damage estimation methodology 10 are produced using a supercomputer. The supercomputer performs time-series simulations or estimations of the forces that act on individual structures or portions of structures on the real property. In this way, before an insurance adjuster ever performs an on-site visit to a property, an insurance company can generate damage estimates with substantial accuracy.

In cases where prospective events are modeled, the data can be combined with historical weather data, for example, to assist in estimating, generating, or otherwise setting insurance premiums.

In cases where actual significant weather events are modeled, the data can be combined with data produced by sensors 32 before, during, and after the event. The sensors 32 may include any number of densely or sparsely located sensors. The sensors 32 may include rain gauges, Doppler radar sensors, wind sensors, temperature sensors, atmospheric pressure sensors, mesovortice sensors, downburst sensors, water sensors, motion sensors, seismic sensors, fire sensors, and many other types of sensors related to significant weather events.

Figure 2:
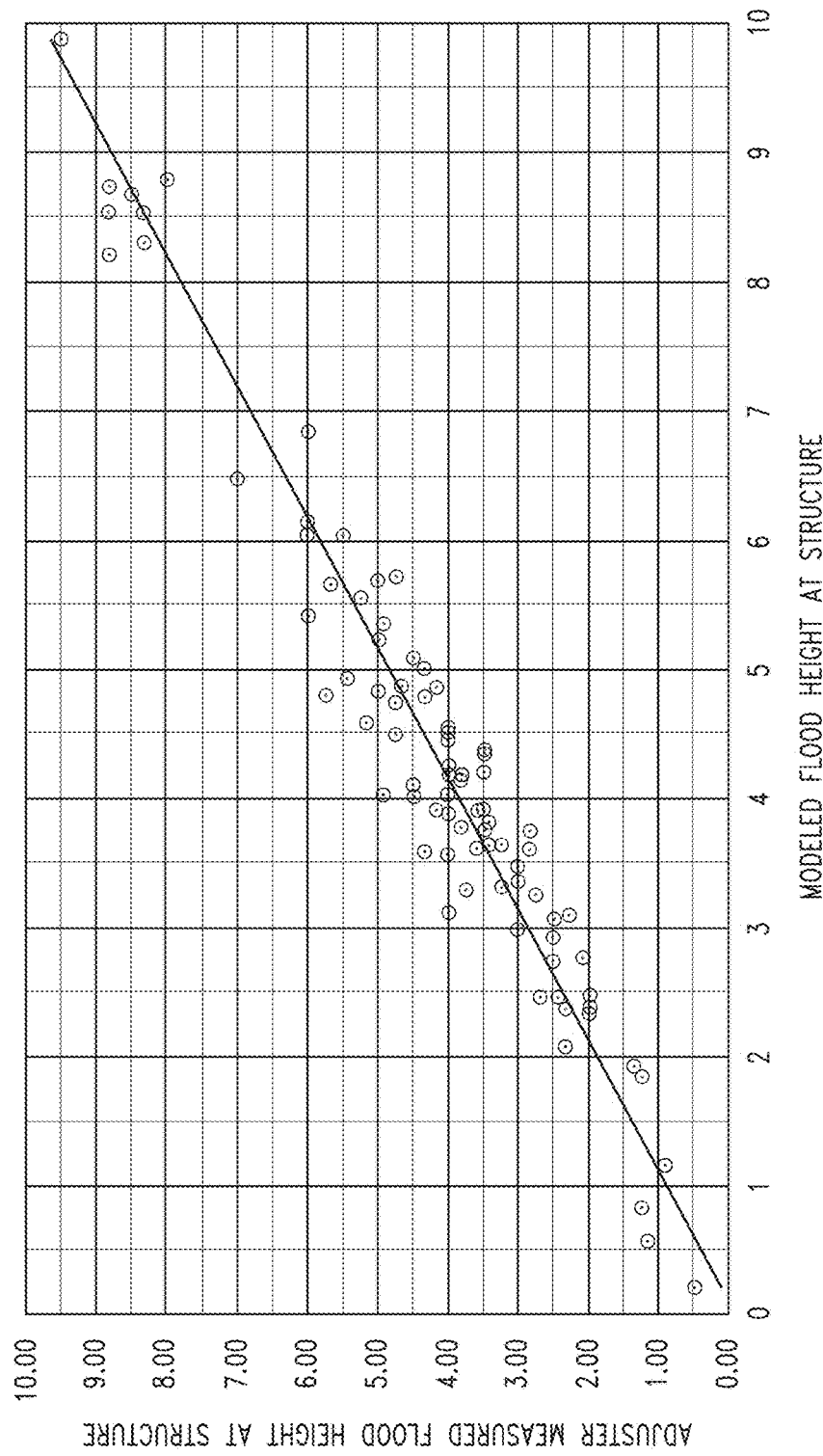
FIG. 2 is a comparison between modeled flood above grade and in situ measured flood above grade.

FIG. 2 is a comparison between modeled flood above grade and in situ measured flood height above grade. The comparison in FIG. 2 is derived from a case study of Hurricane Sandy, which struck in 2012. The vertical axis in FIG. 2 illustrates a measured height of flood waters above grade in feet in a particular zone of hurricane impact. The sloping line represents a computer automated flood line determination calculated using mean LiDAR derived structure elevation data The horizontal axis is used in reference to the sloped line, which represents the modeled height of flood waters above grade in feet in a particular zone of hurricane impact. A quick glimpse of FIG. 2 shows a strong linear correlation between modeled and measured results, and in fact, a statistical comparison between the measured and modeled results shows substantial correlation ($R^2=0.95$) between the in situ measurement and the modeled estimate such that the modeled estimate yielded acceptably equivalent and accurate results for the majority of cases examined.

Upon further review, it is evident in FIG. 2 that the methodology and systems described in the present disclosure were able to produce, with acceptable accuracy, automated flood height estimates that were substantially equivalent to the results generated by in situ measurements obtained for the same properties. Summarizing the results of the analysis represented in FIG. 2, a mean square error=0.234 square feet; a root mean square error=0.484 feet; a median error=−0.009 feet; an upper limit error=1.116 feet; a lower limit error=−1.144 feet; and standard deviation=0.486 feet.

Figure 3:
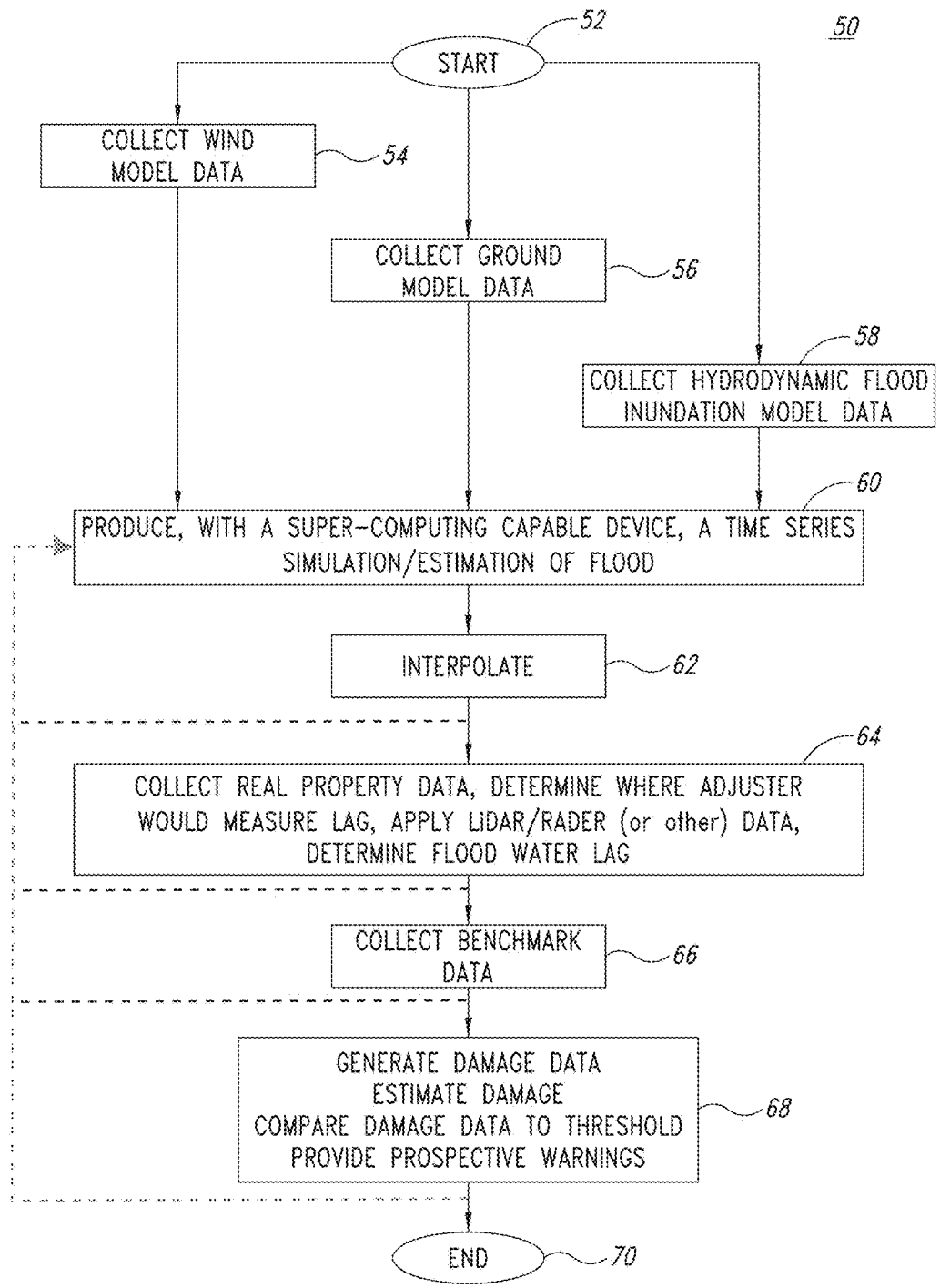
FIG. 3 is a method to accurately estimate damage potential before a significant weather event and to accurately adjust insurance claims following the event.

FIG. 3 is a method 50 to accurately estimate damage potential before a significant weather event and to accurately adjust insurance claims following the event. In some embodiments, the data generated in the method 50 before an imminent significant weather event is used to prospectively warn insured parties and other stakeholders in a geographic area that is predicted to be affected.

Processing in the method begins at 52. At 54, wind model data is collected, generated, or otherwise captured within a supercomputer. The atmospheric wind field models utilize multiple sparse meteorological measurements to accurately reproduce wind direction and speed for any geographic location within a particular area of interest such as an impact area of a storm. In this way, the specific wind velocity, direction, duration, etc. that acts on each particular point of each particular real property structure can be modeled.

Ground model data is collected at 56. In some implementations, ground or other topographical data is collected and processed within a finite element model comprised of a Triangular Irregular Network (TIN) representing ground and bathymetric surfaces in a particular area of interest, along with ground cover surface roughness models to accurately represent the geophysical nature of the terrain. The representation is sufficient to model the effects of the geophysical properties on wind and water flows with substantial accuracy.

At 58, hydrodynamic flood inundation model data is collected. The model data may include two-dimensional (2D) or three-dimensional (3D) data, or the model may include flood data in another form along with data regarding tides, waves, and bathymetry.

The wind, ground, and flood model data from 54, 56, and 58 are processed with a super-computing capable device at 60. The super-computing capable device may include a dedicated supercomputer, a shared supercomputer, a computing farm, or some other high-performance computing hardware scheme. The super-computing device may also include high-performance computing circuitry and middle- or low-performance computing circuitry otherwise associated with mainframe computers, industrial computers, embedded computers, desktop computers, laptop computers, tablet devices, mobile devices (e.g., smartphones), or other types of computing devices. Accordingly, a super-computing capable device may take many forms, and the term super-computer, which is interchangeably used herein for brevity, is understood to encompass any computing device capable of performing super-computing functions.

In some embodiments, the super-computing capable device at 60 is a high performance computing cluster (HPCC) generally capable of performing billions, trillions, or quadrillions of floating point operations per second (FLOPS) or more wherein the operations are related in their support of a common computing purpose or goal. At 60, the super-computing capable device is tasked to produce a time series simulation and accurate reproduction of significant weather event forces at precise geospatial locations. In some cases, such as with hurricane force simulations, the super-computing capable device produces time series simulations of wind and water levels. Time series simulations of other significant weather event forces may also be produced. The time series simulations produced by the super-computing capable device are sufficiently detailed to provide significant weather event force data on individual real property structures and portions thereof at individual parcels of real property.

In the present disclosure, sufficiently detailed means that statistically insignificant differences are expected between the modeled wind and water level points and interpolated values in between discretely modeled points. In some cases, a statistically insignificant difference between the modeled wind and water level points are when the two points are within one percent of each other, two percent of each other, five percent of each other, ten percent of each other, or even twenty-five percent of each other.

In some implementations, the models employed are capable of producing highly accurate estimates of flood above grade for known geospatial data points. The models in some implementations are referenced to a known elevation datum. In one implementation, the utilized model is described as an advanced circulation (ADCIRC) storm surge model that permits the combination of atmospheric pressure and wind data to determine an extent of flood inundation. In addition, or in the alternative, the models are also capable of producing highly accurate estimates of wind force, wind direction, or other significant weather event forces applied to particular structures and portions of structures of real property.

The implementations described herein may perform further acts to fine tune model output data. For example, in the case of the flood elevation, high water marks may be obtained with high resolution sensors that are precisely located using, for example, kinematic global positioning system (GPS) data. In these cases, model output data can be adjusted such that modeled flood height values exactly match the measured flood height values. In this case, by correlating a particular number of known data points with corresponding modeled data points, the remainder of the modeled data points may be mathematically adjusted to thereby improve the model.

At 62, model results produced at 60 are interpolated between sparse computational nodes within the TIN grid. The interpolation permits the analysis of forces that occur during a significant weather event when applied to particular points within a parcel of real property, including the application of forces on identified real property structures and specifically identified portions of the identified structures. The distance between computational nodes within the TIN grid may be selectively chosen to be close enough such that differences between modeled and interpolated values are insignificant with respect to the utility of the results.

Thorough analysis of the modeled data and further modeling occurs at 64. The modeling at 64 may include modeling for any forces that occur during a significant weather event, however, for the sake of brevity and efficiency, the present discussion is directed toward forces associated with flooding. In particular at 64, real property data is collected, one or more locations where an adjuster at a real property site would measure the flood height on the exterior of a structure are selected, electronically collected LiDAR, RADAR, or other data is applied, and an exterior flood water height is determined for one, dozens, hundreds, or thousands of real property parcels. When combined with additional data such as the construction type of the particular structure and floor elevation, a flood height in the interior of the structure may also be determined.

At 64, parcel data is collected and processed. The parcel data may include an electronic representation of a physical description of the real property, the precise geospatial location of structures within the property to an acceptable tolerance, structure outlines extracted from aerial photography or via cadastral maps for example, structure outlines derived from LiDAR data or other means, structure square footage, property value, and property condition. Many other attributes are also considered. In some implementations, precise parcel level information is collected at 56 and processed at 64. In these and other implementations, the precise parcel level information includes digital terrain map information derived from elevation data, which may be obtained remotely by LiDAR, RADAR, or some other remote sensing method. In these implementations, or alternative implementations, the elevation data may also be obtained by some other electronic or non-electronic method including by an on-site geophysical survey of the property. Generally, but not always, the parcel elevation data is referenced to a same elevation datum as is utilized by other models such as the hydrodynamic inundation model of the acts at 58. In the event the parcel data is referenced to a different elevation datum, one or more adjustments may be made such that both model and parcel level information share a common vertical reference.

In at least one embodiment, the flood model described with respect to 64 utilizes (at 56) a finite element model of the terrain represented in a Triangular Irregular Network (TIN). The TIN data file includes a value for ground elevation at each node within the network. In some implementations, the distance between nodes varies, with the smallest elements being about 150 feet in areas of particular interest in one embodiment and small enough such that interpolated samples between nodes produce errors that are statistically insignificant in terms of the utility of the application in other embodiments. In still other embodiments, other distances that may be greater or smaller than 150 feet are also considered. In these implementations, mean water height at a specific point can be determined. For example, a nearest neighbor interpolation scheme can be employed to determine water height at any given point between nodes. Interpolation is effective in these cases because mean water height can be reasonably represented as a plane between node elements. Generally speaking, a slope in a plane of water may be measured to vary less than four (4) inches within a one square mile radius.

The hydrodynamic model employed at 58 is highly accurate when compared with carefully surveyed post storm benchmarks. On the other hand, it was recognized by the inventors that producing accurate ground model results for flood height determination in the absence of carefully surveyed data was a difficult problem to solve. Particularly, heretofore, determining the acceptably precise ground elevation at the point where an adjuster would make the measurement during an on-site visit to the storm damaged property is neither easy nor intuitive.

In some early testing of the innovation systems and methods presented herein, a Lowest Adjacent Grade was determined. The Lowest Adjacent Grade (LAG) geographic point as used herein may be considered as the point where an adjuster would make the measurement during an on-site visit to the storm damaged property. More specifically, LAG is a term used by the Federal Emergency Management Association (FEMA) in elevation certificates for the National Flood Insurance Program (NFIP). LAG, for example, is a lowest elevation next to a structure. Determining the elevation of a flood at LAG yields the highest exterior flood height on the structure.

One method carried out to determine LAG is to utilize ground classified LiDAR returns to define a digital terrain profile around the boundaries of a real property structure such as a building. This method is well described in a report prepared for Dewberry LLC under contract to FEMA "Evaluation of Alternatives in Obtaining Structural Elevation Data, Appendix-J", Computational Consulting Services, LLC, Jan. 31, 2004.

In later testing, more efficient and still effective systems and methods have been discovered. For example, in some embodiments, collecting and processing a median value of LiDAR points adjacent to a structure, such as within a five (5) meter buffer area, has been found to provide a lowest ground surface point around a particular structure with acceptable accuracy and faster processing speed. In other embodiments, a median value of some plurality of sampled points is otherwise adjusted via kriging, inverse distance weighting, multivariate interpolation, or some other estimation technique. Accordingly, while a determination of a LAG or similar elevation data may be consistently produced using computing resource-intensive LiDAR techniques, such techniques may be considered optional. That is, while the use of the term LAG value is used throughout the present disclosure, other techniques that produce consistently acceptable elevation values may be interchangeably used herein as the identified LAG value.

In the processing at 64, the "virtual elevation" calculation for the model is generally consistent with water line results that are obtained through standard, on-site adjusting practice. This consistency is achieved by finding the point where the flood height measurement would ordinarily be made, and relating the modeled result to a known vertical datum such as the North American Vertical Datum of 1988 (i.e., NAVD88), which is also utilized by the flood model. Thus, the particular modeling at 64 utilizes hyper-local terrain data to determine the difference between the modeled flood heights and the terrain at a specific point. More specifically, in order to determine flood height at any given point within the TIN, a correctly referenced ground elevation is subtracted from the interpolated flood height at that point. Merely interpolating from the ground elevation at the nodes of interest has been determined ineffective because, unlike a planar water surface, the ground elevation is highly irregular. For example, an average elevation value determined by simple interpolation will typically return large errors. This problem can be solved by utilizing LiDAR, RADAR, or some other data to determine the slope of the land close to the structure of interest. After the slope (i.e., grade) is determined, some basic algorithms are applied to estimate the LAG value for the real property structure of interest. The LAG estimate yields the suitably correct reference to the point where an adjuster would determine the upper flood height on the real property structure. This approach also provides an elevation correctly referenced to the vertical datum utilized by the model. For example, when a LiDAR derived LAG value is subtracted from the total flood height produced by the model at the geographic point of interest (e.g., at the latitude and longitude corresponding to the approximate LAG), a flood height estimate consistent with the results determined by a trained insurance claims adjuster using a tape measure in an on-site visit is obtained.

Yet one more technique optionally performed at 64 is a hyper-local average or median terrain elevation algorithm. In this optional technique, a hyper-local average of the terrain height within the parcel boundary and very close to the structure of interest is determined. This approach was shown to be sufficiently accurate in areas where terrain height changes are subtle (e.g., relatively low terrain found very close to coastlines.) Utilizing the averaging method, LiDAR or some acceptably accurate terrain height information is obtained at points close to the structure. These values are then averaged to obtain a substantially accurate elevation of the structure of interest. By performing a median, hyper-local averaging, or some other data-smoothing technique, spurious misclassified ground returns resulting from bushes, cars, decks, lawn furniture, small potholes, and the like are effectively filtered out.

Benchmarking data is collected at 66. Comprehensive meteorological data such as wind speed and direction, tides, RADAR cross sections, stream heights, atmospheric pressure, and other data is collected before, during, and in some cases after the significant weather event. Benchmark force measurements such as wind and water level measurements are made at a few locations during and immediately following the significant weather event.

At 68, one or more models are applied to estimate damage resulting from significant weather event forces such as floods and excessive wind levels. Interpolated model results are input to a damage estimate model that uses statistical loss data for structure and content losses that result from various significant weather event forces (e.g., wind and water levels). The loss estimate can be utilized to provide situational awareness for planning and reserve calculations, and further utilized to accelerate and/or complete the insurance claim settlement process. This process can further be utilized to analyze losses from actual events or utilized to simulate potential losses for actuarial and underwriting purposes. For risk analysis and underwriting, hundreds or thousands of simulations can be run on the super-computing capable device to build risk profiles for individual properties over any size geographic area of interest.

In some cases, the method at 50 may be used to provide advance warnings by timely delivering location and event impact specific messages. Such messages can enhance safety and protect property in advance of a significant weather event such as a land-falling hurricane. In these and in other cases, the method at 50 can also be utilized to structure and deliver post-impact action messaging once the impact of the significant weather event has been modeled.

For example, when a hurricane reaching land is imminent, the location and magnitude of the storm forces may be well-characterized as early as two to three days before the hurricane makes landfall. When this advance knowledge is combined with georeferenced insurance policy information, the potential impacts to individual properties and structures may be analyzed, forewarned, and mitigated with advance protective action. This analysis of the potential impacts at a geo-located address can also be turned into actionable information for the property owner or other stakeholders with regard to personal and property safety. In particular, for example, with advance warning, people can take steps to seek shelter and protect property including important papers, vehicles, pets, livestock, valuables, and other items.

In addition to steps that can be taken in advance of a significant weather event, property owners can also be provided with information regarding documentation and insurance company contact procedures that can be taken after the significant weather event to facilitate and accelerate the claims processing process. The modeled results can be updated before, during, and after the significant weather event to provide information useful to property owners and other stakeholders before, during, and after each of these event timeframes.

The messaging system in the method at 50 can be implemented in the processing at 68. For example, as discussed herein, damage data is generated and damage estimates are formed. In addition, geographic locations, property attributes, and certain policy details can also be input into the system. Subsequently, in some optional embodiments at 68, a plurality of personal and property damage thresholds are also be determined. By comparing damage data to corresponding thresholds and examining the results in light of the modeled impacts, certain properties can be identified to determine where and how pre-determined thresholds may be exceeded during a modeled significant weather event. The modeled impacts may be cross-referenced with contact information associated with the corresponding property, and automated or human-delivered messages to the respective contact information may be performed.

In some messaging system embodiments at 68, a generated contact list can be utilized by a customer service representative, an automated electronic mail system, a short message service (SMS) generation tool, a text-to-speech system, or some other system to deliver a desired message. In these and other messaging system embodiments, the generated warning or informational data produced at 68 may be used by an insurer or its surrogate, public safety officials, utilities, first responders, and others.

One or more optional feedback paths are included in the method 50 to accurately estimate damage potential before a significant weather event and to accurately adjust insurance claims following the event (FIG. 3). The feedback paths are illustrated between the acts at 62, 64, 66, 68, and 70. The feedback mechanism allows raw or further processed model output data to be fed back into the super-computing capable device for additional processing or tuning of the model. The data that is fed back, which may include measured high water marks for example, may be drawn from actual human observations, retrieved from additional databases, or captured by a sensor or another device that is manually or electronically monitored. For example, in some cases, power that operates or interrogates communication portions of remote sensors may not be operative during a storm or when model data is first operated on, but in the hours and days after a storm, additional field-level data that is known to be accurate may be captured and used to supplement the model such that updated model output data is produced.

In the method 50 of FIG. 3, to accurately estimate damage potential before a significant weather event and to accurately adjust insurance claims following the event, models are run on a selected finite element grid for an affected area. The models are then adjusted (e.g., via one or more feedback operations) to match locations where significant weather event benchmark measurements are made during and immediately following the significant weather event. The significant weather event benchmark measurements are accurate to an acceptable tolerance.

Parcel and structure location data is collected for real properties and real property structures of interest, and the data is combined (i.e., overlaid, integrated, analyzed, etc.) with the results produced by the computer model. Model results for significant weather event forces such as wind levels and flood heights are calculated at the finite element grid points. The model results are then interpolated on a case-by-case basis, to the specific geolocation of the individual real property structures of interest. For example, to determine flood height on a structure, remotely sensed or on-site elevation data at the structure boundary is obtained. Then, an interpolated value for flood height is obtained at the specific location of the structure boundary. The surface elevation at the structure boundary is subtracted from the interpolated value for flood above grade produced by the flood model, and the result indicates an acceptably precise estimate of the flood level on the real property structure. In some implementations, flood level on a particular real property structure is determined at 15 minute intervals. This type of implementation is arranged to calculate a length of time that flood waters were in contact with the structure. Considering another significant weather force, wind speed and wind direction at the chosen geospatial location is interpolated from a wind field computing grid at 15 minute intervals or some other time interval as appropriate. From this analysis, wind force and direction acting on the selected real property structure can be calculated over the duration of the event. The highest calculated wind and water levels, along with other significant weather event forces in some implementations, are obtained for each real property structure of interest.

In one exemplary implementation, the methods and systems discussed in the present disclosure were practiced on about 100 real properties in the area affected by Hurricane Sandy. The test case produced acceptable results including modeled flood height estimates that were, on average, within a fraction of an inch of the actual insurance adjuster measured values and with a median error very near statistical zero.

Processing in the method 50 of FIG. 3 ends at 70.

Figure 4:
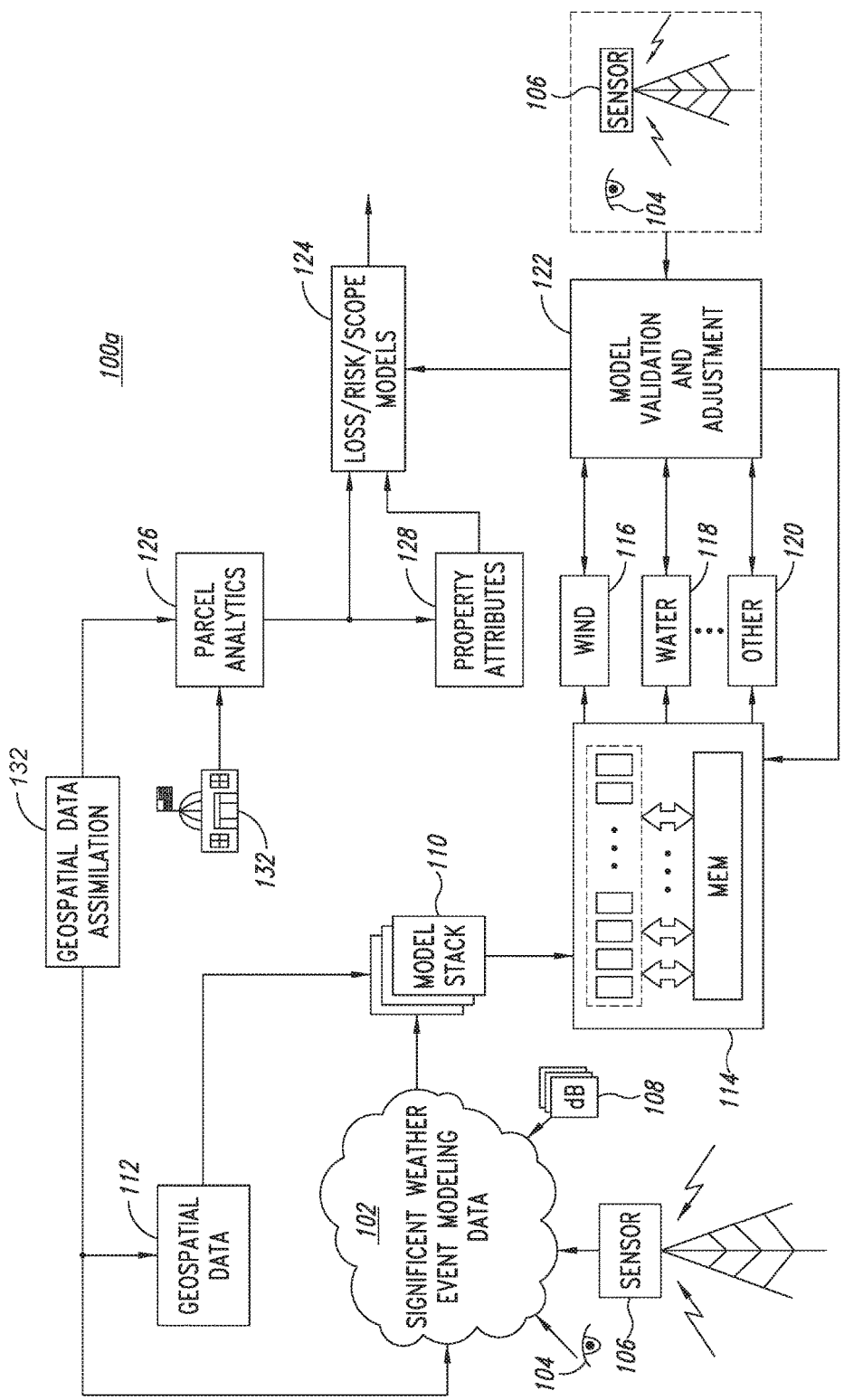
FIG. 4 illustrates structures and processing in a computer automated quantitative storm damage estimation system.

FIG. 4 illustrates structures and processing in a computer automated quantitative storm damage estimation system 100a. The computer automated quantitative storm damage estimation system 100a of FIG. 4 may be used to implement portions of the method 50 in FIG. 3 to accurately estimate damage potential before a significant weather event and to accurately adjust insurance claims following the event.

Significant weather event modeling data 102 is identified, captured, or otherwise gathered. The significant weather event modeling data 102 may include human observation data 104, sensor collected data 106, database data 108, or other forms of data.

Human observation data 104 includes data observed or observable by a human being. The data may include physical measurements made by a human being using rulers, depth gauges, rain gauges, transoms, pressure sensors, or any other mechanical or electronic devices.

The sensor collected data 106 may include data from any number of permanently or temporarily located sensors such as temperature sensors, wind sensors, buoys, atmospheric pressure sensors, and the like. The sensors may communicate autonomously or with manual intervention over a wired or wireless medium, such as a cable, a cellular network, or any other type of electromagnetic frequency medium. In some cases, the sensors may collect data which is later retrieved manually or electronically by a human or another electronic device.

Database data 108 includes data retrieved from any number of databases. The data may be collected from public sources or private. In some cases, the database data 108 is understandable by a human, such as street addresses, latitude and longitude data, real property structural data such as from a municipal assessor's office, and the like. In other cases, the database data 108 is encoded or otherwise not understandable by a human observer. The database data 108 may include geographic information system (GIS) data, energy systems data, forest service data, geological data, emergency disaster data, Highway transportation data, government entity (e.g., Federal Emergency Management Agency (FEMA)) data, and many others.

The significant weather event modeling data 102 includes real time or simulated geophysical observations. The significant weather event modeling data 102 may include actual observed or measured data. In addition, or in the alternative, the significant weather event modeling data 102 may include simulated data, estimated data, interpolated data, or other data that is scientifically generated. Significant weather event modeling data 102 may include any data that pertains to wind, precipitation volume over time, water height, water velocity, tides, wave height, radar cross sections, atmospheric pressure, and rainfall, seismic data, and the like. In some cases, weather event modeling data 102 is prioritized to remove or diminish the contributory value of conflicting results as part of optional quality control procedures. In these cases, data that is more trusted is biased or otherwise weighted over data that is less trusted. For example, in situ data from a trusted sensor may be biased over radar data. As another example, human-observed data may biased over electronically collected sensor data or vice versa.

The significant weather event modeling data 102 is consolidated along with other modeling information in a model stack 110. The other modeling information may include terrain modeling information 112. The model stack 110 includes any number of model data packages. Model data packages include information, algorithms, data points, data structures, templates, and other computer readable data arranged to direct a computing device to accept input data and produce output data according to a particular model. In one example, an atmospheric model is a mathematical model constructed around the full set of primitive dynamical equations which govern atmospheric motions. Forecasts are computed using mathematical equations for the physics and dynamics of the atmosphere.

The model stack 110 illustrated in FIG. 4 may include packages of data to model global weather, wind fields in any number of large and small geographic areas, ocean waves, ocean tide, advanced circulation storm surge (ADCIRC), hurricane weather research and forecasting (HWRF), real time mesoscale analysis (RTMA), land surfaces, terrain, hydrodynamics, tectonic plate pressure, urban building structures, volcanic activity, subterranean magma activity, groundwater runoff, subterranean hydraulic forces, oil drilling, mining, fracking, tunneling, and the like.

One exemplary model stack is now described in more detail. The exemplary model stack describes ADCIRC super-computing algorithmic processing and data, though other model stacks are also contemplated.

The advanced circulation (ADCIRC) storm surge model combines atmospheric pressure, and wind forecasts to predict when, where, and to what extent storm surge flooding will inundate a coastal community. The ADCIRC model is now known to predict coastal flooding with greater precision than other conventionally available models. The increased precision acts as a super-computing based tool that helps decision-makers identify which locations to evacuate as a storm approaches. In addition, the tool enables better planning for storm mitigation and response.

Various ADCIRC modeling systems have been under development since the 1990's. An ADCIRC system in one form or another has been used by the Federal Emergency Management Agency (FEMA) and other government organizations, such as the U.S. Army Corps of Engineers. since the early-2000s.

Stated succinctly, an ADCIRC model is a two-dimensional or three dimensional, depth-integrated, barotropic time-dependent long wave, hydrodynamic circulation model. ADCIRC models can be applied to computational domains encompassing the deep ocean, continental shelves, coastal seas, and small-scale estuarine systems. Typical ADCIRC applications include modeling tides and wind-driven circulation, analysis of hurricane storm surge and flooding, dredging feasibility and material disposal studies, larval transport studies, and near shore marine operations. In some cases, an optional Simulated Waves Nearshore (SWAN) module is coupled to an ADCIRC model to forecast or otherwise model wave height. In these cases, an ADCIRC model as used in the present disclosure may include an additional toolset to generate SWAN modeling data.

An ADCIRC model includes or otherwise directs a highly developed computer program that solves complex motion equations applied to a moving fluid on a rotating earth. The complex motion equations are formulated using traditional hydrostatic pressure and Boussinesq approximations. The equations have also been discretized in space using finite element (FE) methods and discretized in time using finite difference (FD) methods.

In some embodiments, ADCIRC boundary conditions asserted in the model include:
specified elevation (e.g., harmonic tidal constituents or time series),
specified normal flow (e.g., harmonic tidal constituents or time series),
zero normal flow,
slip or no slip conditions for velocity,
external barrier overflow out of the domain,
internal barrier overflow between sections of the domain,
surface stress (wind and/or wave radiation stress),
atmospheric pressure,
outward radiation of waves (Sommerfield condition),
and others.

In some embodiments, and ADCIRC model can be forced with a plurality of other boundary conditions, including:
elevation boundary conditions,
normal flow boundary conditions,
surface stress boundary conditions,
tidal potential, and
earth load/self-attraction tide.

An ADCIRC model set can be run on a super-computing enabled device as a two-dimensional depth integrated (2DDI) model or as a three-dimensional (3D) model. In either case, elevation can be obtained by solving a depth-integrated continuity equation in Generalized Wave-Continuity Equation (GWCE) form, and velocity can be obtained by solving either the 2DDI or 3D momentum equations. All non-linear terms have been retained in these equations.

In addition, and ADCIRC model may also include a least squares analysis routine or some other regression analysis to compute harmonic constituents for elevation and for depth-averaged velocity during the course of the modeling run. By providing the analysis, the model avoids the need to write out long time-series for post processing.

FIG. 6 is an exemplary ADCIRC model output data set 600 generated by the inventors for one specific address. Similar model output data sets were also generated for hundreds of other addresses, and thousands more were possible. The output data set 600 illustrates modeled wind force and water elevation data that occurred during Hurricane Katrina at a particular point of interest. In the data set 600 of FIG. 6, the point of interest is geocoded at a particular latitude and longitude (i.e., 30.123N, −89.456 W), which corresponds to an identifiable street address (i.e., 123 John Dough street, Waveland, Miss.). The actual latitude/longitude and street address in FIG. 6 is purposefully obscured. Nevertheless, the inventors have verified the substantial accuracy of the wind and water model data and very precise points in a geographic area of interest provided by the ADCIRC model.

In the output model data set 600 of FIG. 6, a horizontal axis linearly plots a 12-hour time window on a particular day (i.e., Aug. 29, 2005). A left vertical axis of the plot linearly maps water elevation in feet, and a right vertical axis linearly plots wind speed in miles per hour (mph). A force key 602 identifies the significant weather event forces (i.e., wind, water) illustrated in the plot, and a vector key 604 identifies a northerly direction represented in the plot.

The output model data set 600 illustrates wind velocity and direction 606 that was estimated during the time window on real property structures at the specific parcel of interest. When an insurance company understands additional data about the parcel such as the placement, size, and orientation of real property structures on the parcel, the construction materials used in the real property structures, and other such data, the insurance company can then understand the type of damage that might have occurred by the peak north, northwesterly 115 mph winds that occurred at about 8:00 am on Aug. 29, 2005.

Along these lines, the output model data set 600 also illustrates water elevation 608. In view of the data set, an insurance company can understand that at the particular property of interest, water levels during the hurricane remained nil until 8:00 am on Aug. 29, 2005, but then spiked rapidly to 12 feet. The 12-foot storm surge at 8:00 am rose over the next three hours to a height of 25 feet as wind velocity dropped and wind direction changed from north, northwesterly to an easterly bearing.

Another model stack briefly mentioned and that may also optionally be implemented is associated with eyewall mesovortices. A mesovortice is a rotational feature formed in or near the eye of an intense storm. The mesovortice is small relative to the body of the storm (e.g., less than 1%), but comparatively very powerful. Often, wind speed in a mesovortice is 10% higher or more than the eyewall, which may be hundreds of miles per hour of rotational wind speed. A mesovortice generally forms as a storm intensifies, and friction caused by ground-based terrain or structures may cause a mesovortice to drop to ground level causing a tornadic event of significant destruction. The optional mesovortice model stack is configured to identify conditions that lead to mesovortices and conditions or land-based features that cause mesovortices to spawn tornadoes or other high rotational wind speed events.

Yet one more optional model stack that may also be implemented is associated with dual-polarization radar estimated rainfall. Heavy rainfall can contribute significantly to localized flooding during hurricanes, flash floods, and other severe weather events. Radars work by sending out short bursts of radio waves called pulses. These pulses bounce off particles in the atmosphere and the energy is reflected back to the radar dish. A computing device processes the returned signals and draws conclusions about the types of particles encountered, including the direction the particles are moving (the Doppler effect) and the speed of the particles' movement. Conventional radars only transmit horizontal pulses, which lead to a two-dimensional (2D) measurement of particles (i.e. snow, ice pellets, hail, and rain droplets). In contrast, polarimetric radars, also called dual-polarization radars, transmit radio wave pulses that have both horizontal and vertical orientations thereby creating a three-dimensional (3D) image of the air suspended particles. This 3D-dimensional information improves the radar's ability to estimate precise rainfall quantities, and the 3D information can be used as a basis for differentiating between very heavy rainfall, hail, and snow. A statistical correlation between the reflected horizontal and vertical returns is a good indicator of regions where there is a mixture of precipitation types, such as rain and hail. The polarimetric radar model stack is configured to identify conditions that could produce hail or lead to localized flooding events.

Model stack 110 information is passed into a super-computing capable device 114. The super-computing capable device 114 may perform the functions of a supercomputer, a mainframe computer, a personal computer, a mobile computer, a mobile communications computer, (e.g., a smartphone), or some or all of the devices thereof. The super-computing capable device 114 in FIG. 4 is illustrated with an optional plurality of computing cores, memory buses, and memory. For brevity, the individual cores, memory buses, memory devices, input output, and other conventional functions of a super-computing device are not described in detail herein.

In one embodiment, the super-computing capable device 114 is an 856-core supercomputer developed and operated by WORLDWINDS, INC. to run high-end atmospheric, oceanographic, and hydrologic parallel models. The WORLDWINDS HPCC includes 40 Gb/s Infiniband bus connectivity and 120 terabytes of memory storage with the option of hundreds of petabytes of memory storage, and the system in the embodiment was arranged to model and ADCIRC mesh more than 2.5 million nodes.

The significant weather event modeling data 102, terrain modeling information 112, model stack 110 and supercomputer 114 cooperate to perform input automation tasks of the computer automated quantitative storm damage estimation system 100a of FIG. 4. Geospatial and geophysical data assimilated in the model stack initiation is automated and the supercomputer 114 executes the modeling tasks and is arranged to perform real-time updating of geographic and time-series events. The supercomputer 114 performs calculations within a multi-million node mesh generating a representation of significant weather event data in a particular geographic area over a particular window of time.

Supercomputer 114 produces one or more model output data sets. Wind model output data 116, water model output data at 118, and other model output data 120 are illustrated in FIG. 4. The model output data sets may be produced sequentially, concurrently, or at disparate times. The data may be modeled before a significant weather event, during a significant weather event, or after a significant weather event.

The wind model output data 116 includes information associated with wind force, wind direction, and wind duration in a particular geographic area. The wind model output data 116 may be geo-referenced to a particular address, and individual data points within the model output provide time-referenced wind force data at particular portions of particular structures at the particular address. For example, the wind model output data 116 may permit an insurance company to understand what forces were acting on a particular roof of a particular structure on a particular day at a particular time. The insurance company can understand the direction and velocity of the wind, and when this information is combined with other structural information, the insurance company may further understand what reasonable damage may occur or did occur during a particular significant weather event. The wind model output data 116 takes into account surface and terrain features, modeled and measured barometric pressure, and other geospatial and geophysical data.

The water model output data 118 includes information associated with floodwater, tidal water, surge, river overflow, and the like. The water model output data 118 is configured to take into account a plurality of factors such as the natural slope of the ground, bare earth classified LiDAR returns, local slope on any given property, a structural elevation, the flood water height, the flood water height above grade, wind and atmospheric pressure forces that affect the water data, and the like.

As with the wind model output data 116, the water model output data 118 may be geo-referenced to a particular address. The model data may provide information to help understand the effects of water on any particular structure at any particular address within the modeled geographic area over the course of the modeled time window.

As discussed herein, wind and water model data is described with respect to a hurricane. It is recognized that significant weather events may produce different significant weather event forces that may also be modeled. The other-model-output data 120 includes modeling of these different significant weather event forces. As with the wind and water model data sets, the other-model-output data 120 can be referenced to a particular geographic area, a particular address, a particular real property structure, or any other point or area of reference. The other-model-output data 120 may be associated with seismic activity, electromagnetic activity, extreme temperature activity, or any other forces associated with a significant weather event as discussed herein.

In some embodiments, such as the embodiment of FIG. 4, the model output data is passed to a model validation and adjustment module 122. The model validation and adjustment module 122 applies a feedback mechanism to the super computer 114 such that particular points in the model output data may be correlated with observed or actual measurements. The observed or actual measurement data that is input to the model validation and adjustment module 122 may include human observation data 104 or sensor collected data 106 that is manually or electronically input to the model validation and adjustment module 122. For example, during a storm, an observer may be able to measure actual flood level data with a highly accurate global positioning system (GPS). As another example, particular electronic sensors may collect and deliver data in real-time during a storm or, deliver their stored data payload after the storm.

The model validation and adjustment module 122 is configured to validate the model output data according to data that is observed or measured during a significant weather event, after a significant weather event, or at other times when updated data will benefit the accuracy of the model output data produced by supercomputer 114. In this way, the model validation and adjustment module 122 cooperates with the supercomputer 114 to adjust the data the supercomputer 114 operates on. The updated data is incorporated in the modeling that produces model output data.

In some cases the model validation and adjustment module 122 permits human intervention to adjust model output data to known accurate data and best fit the modeled mesh across the entire geographic area of interest. In one embodiment, a cubic spline interpolation algorithm is integrated into the model validation and adjustment module 122. In the algorithm, the modeled points in the geographic area of interest are associated with each other such that the points may be interpolated in any number of directions to reduce interpolation errors that may otherwise build up through many iterative calculations and orders of data and curve fitting in the supercomputer 114.

After the iterative process between the model validation and adjustment module 122, the supercomputer 114, and the model output data is complete, particular data drawn from the wind model output data 116, the water model output data 118, and the other-model-output-data 120 is passed to a loss/risk/scope modeling module 124. In some cases the data passed to the loss/risk/scope modeling module 124 includes geo-referenced flood height, flood duration, wind speed, and wind direction data associated with particular points at every real property address in the geographic area of interest.

In addition to receiving data from the model validation and adjustment module 122, the loss/risk/scope modeling module 124 receives data from a parcel analytics module 126 and a property attributes module 128. The parcel analytics module 126 receives data from a government entity 130 and a geospatial data assimilation module 132.

A geospatial data assimilation module 132 is configured to assimilate a wide variety of geospatial data into one or more formats suitable for the computer modeling of the computer automated quantitative storm damage estimation system 100a. The geospatial data assimilation module 132 may optionally configure any of the significant weather event modeling data 102, surface attribute data of the terrain modeling information module 112, and data associated with the parcel analytics module 126.

By one analogy, the forces of a significant weather event may be thought of as a fluid. All of the aspects of the fluid are represented in a numerical system. When all of the forces are known statically at a particular point in time, the principles of fluid dynamics may be applied to the numerical system to understand where and how the significant weather event forces will evolve as time passes. As new and updated significant weather event force data is acquired, the new data is also assimilated into the system. The assimilation process may include weighting, filtering, probability distributions, and other algorithms to properly weight all of the data for use in the computing devices of the computer automated quantitative storm damage estimation system 100a.

The parcel analytics module 126 provides parcel level and structural data to the loss/risk/scope modeling module 124 and the property attributes module 128. The parcel level analytics module 126 will typically draw information from a government entity database 130, though input data to the module may come from any number of other sources. Examples of the data captured and processed by the parcel level analytics module 126 includes elevation data from LiDAR returns, remotely sensed imagery (e.g., which may collected by earth orbiting satellites, airplanes, remotely piloted vehicles, and autonomous vehicles), survey data, and data from a municipal assessor's office. The data may include information associated with the particular parcel such as the number of real property structures, the size of real property structures, the height of real property structures, the orientation of real property structures on the parcel, the footprint of the real property structures, structural attributes such as the number and type of rooms, construction materials, roof size, natural and man-made features of the parcel that are not real property, the value of the real property and its associated structures, and a wide variety of other data.

Data from the parcel level analytics module 126 is collected and aggregated in the property attributes module 128. The property attributes module 128 produces a data set associated with each individual property address in the geographic area of interest. The information in the data set includes data associated with the real property structures located on the parcel and the interrelationship of the real property structures to natural and man-made features within the specific parcel and within other parcels nearby the specific parcel.

Figure 5:
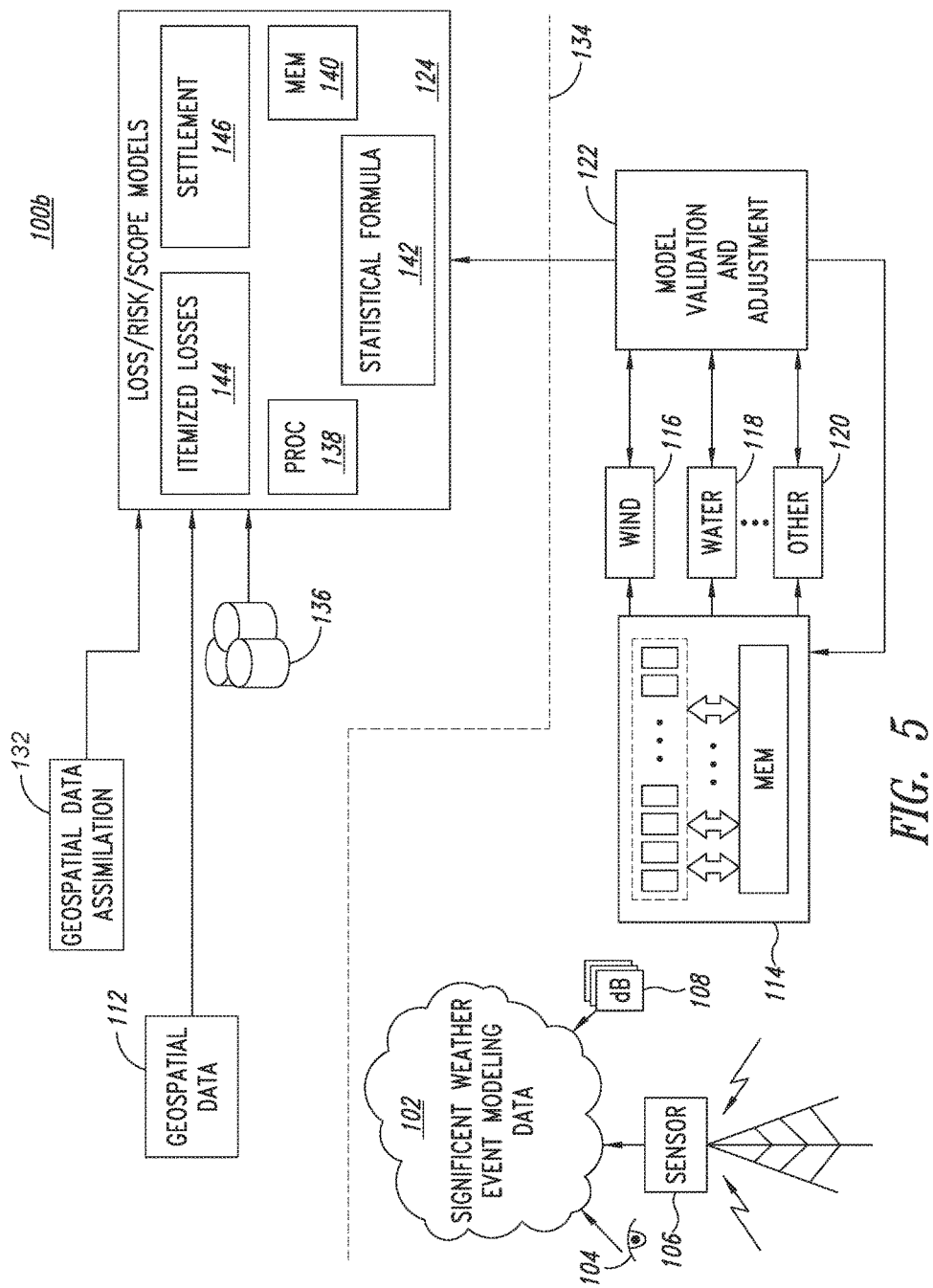
FIG. 5 illustrates structures and processing in a significant weather event claims automation system.

The loss/risk/scope modeling module 124 of FIG. 4 is described in more detail with respect to FIG. 5.

FIG. 5 illustrates structures and processing in a significant weather event claims automation system 100b. A dashed demarcation line 134 is illustrated in FIGS. 4 and 5. The dashed demarcation line 134 distinguishes logical functions of the computer automated quantitative storm damage estimation system 100a in FIG. 4 from the structures and processing in a significant weather event claims automation system 100b in FIG. 5. To simplify understanding of the present disclosure, features that are common to both the computer automated quantitative storm damage estimation system 100a and the significant weather event claims automation system 100b are illustrated in both FIGS. 4 and 5 with a common configuration and with common reference identifiers.

The loss/risk/scope modeling module 124 applies one or more statistical model algorithms to its input data. The statistical model algorithms generate likely estimates of damage predicted to have occurred during a significant weather event or that predictably will occur in a future significant weather event. The loss/risk/scope modeling module 124 of FIG. 5 is illustrated with a processor 138 and memory 140. Generally speaking, the loss/risk/scope modeling module 124 is implemented with a computing device. In some cases, the computing device associated with the loss/risk/scope modeling module 124 is a separate and distinct computing device; in other cases, the functions of the loss/risk/scope modeling module 124 are carried out using some portion of the super-computing capable device 114. In these cases, it is recognized that the functions of the loss/risk/scope modeling module 124 will generally not require super-computing capabilities, though as previously described, the super-computing capable device 114 may include computing capabilities of a mainframe computer, a desktop computer, a personal computer, or some other computing device.

The loss/risk/scope modeling module 124 includes a statistical formula module 142, an itemized losses module 144, and a settlement module 146. The loss/risk/scope modeling module 124 receives terrain information 112 that is processed with the geospatial data assimilation module 132, insurance policy information from an insurance policy database 136, and modeled significant weather event force data from the model validation an adjustment module 122.

The insurance policy database 136 is configured to supply insurance policy information associated with any insured property within the geographical area of interest. The insurance information may include policy account numbers, policy owners and beneficiaries, contact information, policy term, policy limits, exclusions to the policy, deductible information, premium data, and many other data items associated with any given insurance policy.

The statistical model algorithms of the loss/risk/scope modeling module 124 are implemented in the statistical formula module 142. The statistical formula module 142 is configured to isolate the modeled significant weather event force data information from model validation and adjustment module 122 and apply the information to insured features of the subject property. For example, when the modeled significant weather event is a hurricane, it is recognized that damage to real property structures may occur from both wind and water. In these cases, the statistical formula module 142 will apply the wind information to features of the real property structures to estimate the type and amount of damage that may occur to the real property structures due to the wind. The type and amount of damage estimated may include, for example, a predicted dollar amount of damage that may occur to the roof of a real property structure on the subject property. Also in this case, the statistical formula module 142 will apply the water information to the features of the real property structures to estimate the type and amount of damage that may occur to the real property structures due to water. The same formulas may be applied with other significant weather event forces such as seismic forces, mesovortices, extreme temperatures, and the like.

In one exemplary embodiment, the statistical formula module 142 determines a subject property parcel based on its property address and in addition, or in the alternative, based on an address geocode (e.g., computer readable latitude/longitude). The statistical formula module 142 will identify a date or date range and a time window when a particular loss (i.e., damage) occurred to one or more real property structures located on the parcel. Using the address data, and the time/date ranges, the statistical formula module 142 works cooperatively with the output data from the computer automated quantitative storm damage estimation system 100b. The output data is produced with the super computer 114 and may include wind model output data 116, water model output data 118, and other-model-output data 120. Considering that the significant weather event that occurred during the subject time/date range is a hurricane, the modeled output data may include a wide variety of information such as:

whether or not the parcel of interest suffered a general and temporary flood condition,
a computer estimated exterior water height,
a computer estimated average ground elevation at the real property structure,
a computer estimated interior water height,
a computer estimated date/time water entered a building,
a computer estimated date/time water receded from the building,
an estimated length of time water remained in the building,
an average or median terrain height
a computer estimated lowest adjacent grade (LAG),
a computer estimated highest adjacent grade (HAG),
a nearest body of water,
a distance of real property structures from the nearest body of water,
the highest wind speed,
the direction(s) of wind,
barometric pressure,
tidal height,
a highest estimated storm surge,
a highest wave height,
an estimated distance from the center of the storm,
a possibility or likelihood of mesovortice activity,
a time of nearest approach of the storm, and
many other types of data.

The statistical formula module 142 will estimate the type of damage caused by flooding and the type of damage caused by wind. In some cases, the damage estimates will also include probability factors, confidence levels in the estimates, or other factors to help focus the estimate of damage caused by an actual or simulated significant weather event. In some cases, the damage estimates are assigned to all of the real property structures on the parcel in aggregate; in other cases, the damage estimates are assigned to individual real property structures on the parcel; and in still other cases, the damage estimates are assigned to specific portions of a real property structure on the parcel (e.g., damage to a south face of a roof, damage to a set of north-facing windows, and the like).

The itemized losses module 144 may work cooperatively with the output data from the computer automated quantitative storm damage estimation system 100b. In these and in other alternative embodiments, the itemized losses module 144 works cooperatively with the output information from the statistical formula module 142. The itemized losses module reconciles damage data with insurance policy data. The damage estimates may be subtracted from policy limit values to determine whether some or all of the damage caused by the significant weather event will be paid for by the insurance company. The itemized losses module 144 may run sequential or iterative processes that evaluate different portions of the insurance policy to provide a highest level of benefit to a particular insured party. For example, in some cases, a real property structure may be covered for wind damage, but not flood damage; in some other cases, the dollar policy limits may be different for wind damage versus flood damage. The itemized losses module 144 may employ margin of error or confidence level estimates determined by the statistical formula module 142 to apply a dollar benefit that most favors the insured party.

Information produced by the statistical formula module 142 and information produced by the itemized losses module 144 is passed to a settlement module 146. The settlement module 146 may determine an estimated dollar amount of insured benefit that has accrued as a result of the significant weather event. This estimated dollar amount may result in the associated information being communicated to the insured party automatically or through a human insurance claims adjuster. In these and other embodiments, the settlement module 146 may automatically begin a process to transfer money to the insured beneficiary, to communicate with service providers for repairs or replacement of the lost property, and to perform other functions associated with claims settlement.

Certain words and phrases used in the present disclosure are set forth as follows. The terms "include" and "comprise," as well as derivatives thereof, mean inclusion without limitation. The term "or," is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation; such a device may be implemented in hardware, firmware, or software, or some combination of at least two of the same. The functionality associated with any particular controller may be centralized or distributed, whether locally or remotely. Other definitions of certain words and phrases are provided throughout this patent document. Those of ordinary skill in the art will understand that in many, if not most instances, such definitions apply to prior as well as future uses of such defined words and phrases.

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

As used in the present disclosure, the term "module" refers to an application specific integrated circuit (ASIC), an electronic circuit, a processor and a memory operative to execute one or more software or firmware programs, combinational logic circuitry, or other suitable components (hardware, software, or hardware and software) that provide the functionality described with respect to the module.

A processor (i.e., a processing unit), as used in the present disclosure, refers to one or more processing units individually, shared, or in a group, having one or more processing cores (e.g., execution units), including central processing units (CPUs), digital signal processors (DSPs), microprocessors, micro controllers, state machines, execution units, and the like that execute instructions.

In the present disclosure, memory may be used in one configuration or another. The memory may be configured to store data. In the alternative or in addition, the memory may be a non-transitory computer readable medium (CRM) wherein the CRM is configured to store instructions executable by a processor. The instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of the systems, methods, and apparatus described in the present disclosure.

FIGS. 4 and 5 illustrate portions of a non-limiting embodiment of a computing device 114, 124. When so arranged as described herein, each computing device may be transformed from a generic and unspecific computing device to a combination device comprising hardware and software configured for a specific and particular purpose. The combination device, when employed as described herein provides improvements to insurance technology, government warning forecasting technology, real property stakeholder maintenance planning technology, and many other technologies. Computing devices 114, 124 include operative hardware found in a conventional computing apparatus such as one or more central processing units (CPU's), volatile and non-volatile memory, serial and parallel input/output (I/O) circuitry compliant with various standards and protocols, wired and/or wireless networking circuitry (e.g., a communications transceiver).

As known by one skilled in the art, a computing device has one or more memories, and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk drive, a floppy diskette, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory.

A computing device known computing devices further includes operative software found in a conventional computing server such as an operating system, software drivers to direct operations through the I/O circuitry, networking circuitry, and other peripheral component circuitry. In addition, the computing device includes operative application software such as network software for communicating with other computing devices, database software for building and maintaining databases, and task management software for distributing the communication and/or operational workload amongst various CPU's. In some cases, the computing devices used herein is a single hardware machine having the hardware and software listed herein, and in other cases, the computing device is a networked collection of hardware and software machines working together in a server farm to execute the functions of the computer automated quantitative storm damage estimation system 100a and the significant weather event claims automation system 100b. The conventional hardware and software of the computing devices discussed herein is not shown for simplicity.

FIG. 3 is a flowchart 50 illustrating processes that may be used by embodiments of the computing devices that implement the computer automated quantitative storm damage estimation system 100a and the significant weather event claims automation system 100b described herein. In this regard, each described process may represent a module, segment, or portion of code, which comprises one or more executable instructions for implementing the specified logical function(s). It should also be noted that in some implementations, the functions noted in the process may occur in a different order, may include additional functions, may occur concurrently, and/or may be omitted.

In the foregoing description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with electronic and computing systems including client and server computing systems, as well as networks, have not been shown or described in detail to avoid unnecessarily obscuring descriptions of the embodiments.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A property damage estimate method, comprising:
collecting geospatial data from a plurality of sensors disparately situated in a defined geographic area, the collecting occurring before and during a determined significant weather event;
providing geospatial property attribute information for each of a plurality of real property structures within the defined geographic area;
estimating, with a super-computing capable device, one or more values representing an intensity and duration of significant weather event forces at each of a plurality points associated with each of the plurality of real property structures according to at least one significant weather event model to produce at least one model output data set;
applying data from the at least one model output data set to the geospatial property attribute information; and
based on application of model output data set data to the geospatial property attribute information, automatically estimating damage to the plurality of real property structures.

2. The property damage estimate method of claim 1 wherein at least some of the plurality of sensors include a light detection and ranging (LiDAR) circuit.

3. The property damage estimate method of claim 1 wherein the at least one significant weather event model includes processing at least one of terrain, atmospheric, and bathymetric model data with a finite element model.

4. The property damage estimate method of claim 3 wherein the finite element model includes a Triangular Irregular Network (TIN) finite element model representing ground and bathymetric surfaces.

5. The property damage estimate method of claim 4 wherein the Triangular Irregular Network (TIN) finite element model represents ground cover and surface roughness.

6. The property damage estimate method of claim 1 wherein at least one significant weather event force is a flood level.

7. The property damage estimate method of claim 6 wherein the at least one significant weather event model includes a hydrodynamic flood inundation model.

8. The property damage estimate method of claim 7, wherein estimating the one or more values representing the intensity and duration of the flood level at each of the plurality of points associated with each of the plurality of real property structures comprises:
determining a natural slope of ground around a real property structure;
determining a lowest adjacent grade (LAG);
estimating a height of flood above grade; and
estimating the flood level at the real property structure.

9. The property damage estimate method of claim 1 wherein the at least one significant weather event model includes an advanced circulation (ADCIRC) storm surge model.

10. The property damage estimate method of claim 1, comprising:
reconciling measured data associated with the determined significant weather event with corresponding data in the at least one model output data set; and
re-estimating, with the super-computing capable device, the one or more values representing the intensity and duration of significant weather event forces at each of the plurality of points associated with at least some of the plurality of real property structures to produce at least one updated model output data set.

11. A property damage estimating system, comprising:
a memory structure, the memory structure storing significant weather event modeling data, geospatial data, and at least one significant weather event model;
a first computing device arranged to carry out acts according to the at least one significant weather event model, the first computing device further arranged to produce at least one model output data set defining estimated significant weather event force data over a defined geographic area of interest;
a second computing device arranged to reconcile benchmarking data collected after a significant weather event with at least some of the significant weather event modeling data, the reconciled benchmarking data made available to the first computing device to update the at least one model output data set; and
a third computing device arranged to statistically combine data from the at least one model output data set with at least some of the geospatial data to produce a damage estimate for each of a plurality of points at each of a plurality of real property structures within the defined geographic area of interest, wherein the first computing device and the second computing device are a super-computing capable device.

12. The property damage estimating system of claim 11 wherein the significant weather event is a hurricane.

13. The property damage estimating system of claim 11 wherein the defined geographic area of interest is greater than 100 square miles and wherein the plurality of real property structures is greater than 1,000.

14. The property damage estimating system of claim 11 wherein the at least one model output data set defines estimated flood water data, estimated wind force data, and estimated wind duration data.

15. A non-transitory computer-readable storage medium whose stored contents configure a computing system to perform a method, the method comprising:
 collecting at least one of atmospheric model data and oceanographic model data;
 collecting ground model data;
 retrieving at least one significant weather event model;
 producing, with a super-computing capable device, a time series simulation of significant weather event forces that occur over a geographic area of interest during a significant weather event;
 interpolating the simulated significant weather event forces to a plurality of nodes within the geographic area of interest;
 collecting benchmark data associated with the significant weather event;
 feeding the collected benchmark data back to the super-computing capable device; and
 estimating damage for each of a plurality of points at each of a plurality of real property structures within the geographic area of interest.

16. The non-transitory computer-readable storage medium according to claim 15 whose stored contents configure the computing system to perform the method, the method further comprising:
 collecting light detection and ranging (LiDAR) data associated with a plurality of points within the geographic area of interest;
 determining a natural slope of ground around a real property structure based on the collected LiDAR data;
 determining a lowest adjacent grade (LAG);
 estimating a height of flood above grade; and
 estimating a flood level associated with at least one real property structure.

17. The non-transitory computer-readable storage medium according to claim 15 wherein the significant weather event is a man-made event.

18. The non-transitory computer-readable storage medium according to claim 15 wherein the at least one significant weather event model includes a Triangular Irregular Network (TIN) finite element model representing ground and bathymetric surfaces.

19. The non-transitory computer-readable storage medium according to claim 15 wherein the simulated significant weather event forces include water forces and wind forces.

* * * * *